(12) United States Patent
Yang et al.

(10) Patent No.: US 12,015,095 B2
(45) Date of Patent: *Jun. 18, 2024

(54) SOLAR CELL AND PHOTOVOLTAIC MODULE

(71) Applicants: ZHEJIANG JINKO SOLAR CO., LTD, Zhejiang (CN); JINKO SOLAR CO., LTD., Jiangxi (CN)

(72) Inventors: Jie Yang, Zhejiang (CN); Peiting Zheng, Zhejiang (CN); Xinyu Zhang, Zhejiang (CN); Hao Jin, Zhejiang (CN)

(73) Assignees: ZHEJIANG JINKO SOLAR CO., LTD, Yuan Hua Town (CN); JINKO SOLAR CO., LTD., Jiangxi (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/098,343

(22) Filed: Jan. 18, 2023

(65) Prior Publication Data

US 2023/0155047 A1    May 18, 2023

Related U.S. Application Data

(63) Continuation of application No. 17/834,409, filed on Jun. 7, 2022, now Pat. No. 11,588,065, which is a
(Continued)

(30) Foreign Application Priority Data

Sep. 30, 2020 (CN) .......................... 202011069475.8

(51) Int. Cl.
*H01L 31/068* (2012.01)
*H01L 31/0216* (2014.01)

(52) U.S. Cl.
CPC .... *H01L 31/0682* (2013.01); *H01L 31/02167* (2013.01); *H01L 31/02168* (2013.01)

(58) Field of Classification Search
CPC ......... H01L 31/02167; H01L 31/02168; H01L 31/068; H01L 31/0682
See application file for complete search history.

(56) References Cited

U.S. PATENT DOCUMENTS

2012/0055538 A1 * 3/2012 Lee ................. H01L 31/03529
136/246
2012/0097236 A1   4/2012 Hu
(Continued)

FOREIGN PATENT DOCUMENTS

| CN | 109346549 A | 2/2019 |
|----|-------------|--------|
| CN | 109461783 A | 3/2019 |

(Continued)

OTHER PUBLICATIONS

Machine translation of CN-210897294-U, Li Shuo. (Year: 2020).*
(Continued)

*Primary Examiner* — Mayla Gonzalez Ramos
(74) *Attorney, Agent, or Firm* — FORGE IP, PLLC

(57) ABSTRACT

A solar cell and a photovoltaic module including the solar cell. The solar cell includes: a semiconductor substrate including a first surface and a second surface opposite to each other; a first dielectric layer located on the first surface; a first N+ doped layer located on a surface of the first dielectric layer; a first passivation layer located on a surface of the first N+ doped layer; a first electrode located on a surface of the first passivation layer; a second dielectric layer located on the second surface; a first P+ doped layer located on a surface of the second dielectric layer; a second passivation layer located on a surface of the first P+ doped layer; and a second electrode located on a surface of the second passivation layer.

14 Claims, 4 Drawing Sheets

Related U.S. Application Data continuation of application No. 17/104,585, filed on Nov. 25, 2020, now Pat. No. 11,387,376.

(56) References Cited

U.S. PATENT DOCUMENTS

| | | |
|---|---|---|
| 2012/0167973 A1 | 7/2012 | Hu |
| 2013/0312813 A1 | 11/2013 | Chuang et al. |
| 2014/0299187 A1 | 10/2014 | Chang et al. |
| 2016/0225931 A1* | 8/2016 | Heng ................ H01L 31/0725 |
| 2016/0276515 A1* | 9/2016 | Chang ................ H01L 31/074 |
| 2018/0114871 A1 | 4/2018 | Lin |
| 2018/0138334 A1* | 5/2018 | Lee ................ H01L 31/0747 |
| 2019/0157496 A1 | 5/2019 | Ji et al. |
| 2020/0287066 A1* | 9/2020 | Stodolny ............ H01L 31/048 |

FOREIGN PATENT DOCUMENTS

| | | | |
|---|---|---|---|
| CN | 109841693 A | | 6/2019 |
| CN | 110071182 A | | 7/2019 |
| CN | 110299422 A | | 10/2019 |
| CN | 110416324 A | | 11/2019 |
| CN | 209658197 U | | 11/2019 |
| CN | 209675297 U | | 11/2019 |
| CN | 110890432 A | | 3/2020 |
| CN | 210897294 U | * | 6/2020 |
| CN | 210897294 U | | 6/2020 |
| CN | 111524982 A | | 8/2020 |
| CN | 111524983 A | | 8/2020 |
| CN | 111628052 A | | 9/2020 |
| EP | 3297043 A1 | | 3/2018 |
| JP | 2014204128 A | | 10/2014 |
| JP | 2016006869 A | | 1/2016 |
| JP | 2019204870 A | | 11/2019 |

OTHER PUBLICATIONS

Ling, Zhi Peng at al., "Double-Sided Passivated Contacts for Solar Cell Applications: An Industrially Viable Approach Topward 24% Efficient Large Area silicon Solar Cells"; in: "Silicon Materials"; Mar. 27, 2019; IntechOpen, XP055800677.

Lozac'h, Mickael at al., "Double-Sided OPCon Solar Cells on Textured Wafer with ALD SiOx Layer"; Solar Energy Materials and Solar Cells, vol. 207, Apr. 1, 2020, p. 110357, XP055800690.

Ok, Young-Woo et al., "Screen Printed, Large Area Bifacial N-type Back Junction Silicon Solar Cells with Selective Phosphorus Front Surface Field and Boron Doped Poli-Si/SiOx passiovated Rear Emitter"; Applied Physics Letters, A I P Publishing LLC, US, vol. 113, No. 26, Dec. 26, 2018, XP012234274.

First Office Action (202011069475.8); Date of Mailing: Sep. 17, 2023.

* cited by examiner

SOLAR CELL AND PHOTOVOLTAIC MODULE

CROSS-REFERENCE TO RELATED APPLICATIONS

This application is a continuation of U.S. patent application Ser. No. 17/834,409, filed on Jun. 7, 2022, which is a continuation of U.S. patent application Ser. No. 17/104,585, filed on Nov. 25, 2020, which claims priority to Chinese Patent Application No. 202011069475.8, filed on Sep. 30, 2020. All of the afore-mentioned patent applications are hereby incorporated by reference in their entireties.

TECHNICAL FIELD

The present disclosure relates to the field of solar cell technologies, and, in particular, to a solar cell and a photovoltaic module.

BACKGROUND

A solar cell is initially considered to be the cleanest and inexhaustible energy source theoretically. At present, with development of science and technology, the solar cell can be stably manufactured in large scale to supply energy, and therefore yield of the solar cell is rising year by year. With development of photovoltaic industry, improving conversion efficiency of the solar cell has become a goal pursued by photovoltaic enterprises. In order to achieve high efficiency of solar cells, a variety of cell structures have been designed, e.g., a passivation contact structure formed by an ultra-thin tunnel oxide layer and a highly doped polysilicon layer prepared at the back side of the cell using tunnel oxide passivation contact (TOPCon) techniques, with advantages of high efficiency, long service life, no LID and good response to weak light, etc. In addition, in the existing solar cells, a double-side solar cell can absorb light on both sides, which greatly increases photoelectric conversion efficiency of the cell per unit area, and therefore, it has attracted more and more attention of all circles of the society.

At present, in a conventional N-type passivation contact solar cell, a substrate is a N-type silicon, a P+-type doped layer is provided at a front side of the cell, and an ultra-thin silicon oxide layer and an N+ heavily doped polycrystalline silicon layer are provided on a back side of the cell. Passivation contact is generally provided at the back side of the cell. To achieve the passivation contact at the front side of the cell or both sides of the cell, it is required to adopt ITO (a transparent conductive layer) at the front side of the cell, similar to the Heterojunction with Intrinsic Thinlayer (HIT) cell structure, so as to solve lateral transmission problem of the ultra-thin polycrystalline silicon. However, on the one hand, although ITO is a transparent conductive oxide, a certain light loss may be caused due to light absorption of ITO, affecting conversion efficiency of the cell; on the other hand, if ITO is used, the ITO may not be compatible with existing high-temperature production lines and high-temperature metallization processes, and cost of upgrading the existing cell production lines is very high.

SUMMARY

In view of this, a purpose of the present disclosure is to provide a solar cell and a photovoltaic module, which can alleviate a compromise restriction between lateral transmission and light absorption of a polycrystalline silicon film when a passivation contact structure is applied to the front side of the cell, increasing a short-circuit current of the cell while achieving a high open-circuit voltage.

In order to achieve the purpose, the following technical solutions are provided.

In a first aspect of the present disclosure, a solar cell is provided. The solar cell includes: a semiconductor substrate comprising a first surface and a second surface that are opposite to each other; a first dielectric layer located on the first surface; a first N+ doped layer located on a surface of the first dielectric layer; a first passivation layer located on a surface of the first N+ doped layer; a first electrode located on a surface of the first passivation layer; a second dielectric layer located on the second surface; a first P+ doped layer located on a surface of the second dielectric layer; a second passivation layer located on a surface of the first P+ doped layer; and a second electrode located on a surface of the second passivation layer.

In an embodiment, the first dielectric layer includes at least one of silicon oxide, hafnium oxide, titanium oxide, silicon nitride, silicon oxynitride, or aluminum oxide; and the first dielectric layer has a thickness in a range from 0.5 nm to 3 nm.

In an embodiment, the first N+ doped layer has a doping concentration in a range from $5\times10^{19}$ cm$^{-3}$ to $6\times10^{20}$ cm$^{-3}$; and the first N+ doped layer has a thickness in a range from 5 nm to 30 nm.

In an embodiment, the first passivation layer includes at least one of silicon nitride, silicon oxide, silicon oxynitride, or silicon carbide; and the first passivation layer have a thickness in a range from 70 nm to 180 nm.

In an embodiment, the second dielectric layer includes at least one of silicon oxide, hafnium oxide, titanium oxide, silicon nitride, silicon oxynitride, or aluminum oxide; and the second dielectric layer has a thickness in a range from 0.5 nm to 3 nm.

In an embodiment, the first P+ doped layer has a doping concentration in a range from $5\times10^{19}$ cm$^{-3}$ to $6\times10^{20}$ cm$^{-3}$; and the first P+ doped layer has a thickness in a range from 80 nm to 300 nm.

In an embodiment, the second passivation layer includes at least one of silicon nitride, silicon oxide, silicon oxynitride, or silicon carbide; and the second passivation layer have a thickness in a range from 70 nm to 180 nm.

In an embodiment, the semiconductor substrate is an N-type semiconductor substrate, the first surface is a front surface of the semiconductor substrate, and the second surface is a back surface of the semiconductor substrate.

In an embodiment, at least one region on the surface of the first N+ doped layer is further provided with a third dielectric layer and a second N+ doped layer, the first electrode penetrates through the first passivation layer to be in contact with the second N+ doped layer, and the at least one region on the surface of the first N+ doped layer corresponds to a region of the first electrode.

In an embodiment, the third dielectric layer includes at least one of silicon oxide, hafnium oxide, titanium oxide, silicon nitride, silicon oxynitride, or aluminum oxide; and the third dielectric layer has a thickness in a range from 0.5 nm to 3 nm.

In an embodiment, the second N+ doped layer has a thickness in a range from 50 nm to 150 nm.

In an embodiment, at least one region of the first N+ doped layer is formed as a thickened N+ doped region, the first electrode penetrates through the first passivation layer to be in contact with the thickened N+ doped region, and the at least one region of the first N+ doped layer corresponds to a region of the first electrode.

In an embodiment, the thickened N+ doped region has a thickness in a range from 80 nm to 200 nm.

In an embodiment, the semiconductor substrate is a P-type semiconductor substrate, the first surface is a back surface of the semiconductor substrate, and the second surface is a front surface of the semiconductor substrate.

In an embodiment, at least one region on the surface of the first P+ doped layer is further provided with a fourth dielectric layer and a second P+ doped layer, the second electrode penetrates through the second passivation layer to be in contact with the second P+ doped layer, and the at least one region on the surface of the first P+ doped layer corresponds to a region of the second electrode.

In an embodiment, the fourth dielectric layer includes at least one of silicon oxide, hafnium oxide, titanium oxide, silicon nitride, silicon oxynitride, or aluminum oxide; and the fourth dielectric layer has a thickness in a range from 0.5 nm to 3 nm.

In an embodiment, the second P+ doped layer has a thickness in a range from 50 nm to 150 nm.

In an embodiment, at least one region of the first P+ doped layer is formed as a thickened P+ doped region, the second electrode penetrates through the second passivation layer to be in contact with the thickened P+ doped region, and the at least one region of the first P+ doped layer corresponds to a region of the second electrode.

In an embodiment, the thickened P+ doped region has a thickness in a range from 80 nm to 200 nm.

It should be noted that each of the above ranges of values includes endpoint values thereof.

In a second aspect of the present disclosure, a photovoltaic module is provided. The photovoltaic module includes solar cells as mentioned above, and at least part of the solar cells is connected to each other in a splicing or stacking manner and sealed by an encapsulating material.

Compared with the prior art, the technical solutions provided by the present disclosure have at least the following beneficial effects:

The solar cell provided by the application includes a first dielectric layer, a first N+ doped layer, a first passivation layer, and a first electrode on a first surface of the semiconductor substrate, and a second dielectric layer, a first P+ doped layer, a second passivation layer, and a second electrode formed on a second surface of the semiconductor substrate. In this way, the effect of double-side passivation contact can be realized. With the aid of the substrate material, a lower lateral transmission resistance can be achieved, that is, the substrate material can be used to assist in the lateral transmission of carriers, alleviating compromise restriction between the lateral transmission and the light absorption of the polycrystalline film when the passivation contact structure is applied to the front side of the cell, increasing the open-circuit voltage and short-circuit current, and avoiding the occurrence of the light absorption of the existing ITO or thick polycrystalline silicon.

The photovoltaic module of the present disclosure includes solar cells mentioned above, and has at least all the characteristics and advantages of the solar cells described above, which will not be repeated here.

It should be understood that the above general description and the following detailed description are only illustrative and do not limit the present disclosure.

BRIEF DESCRIPTION OF DRAWINGS

In order to more clearly illustrate technical solutions of embodiments of the present disclosure or the technical solutions in the related art, the accompanying drawings used in the embodiments or the related art are briefly described below. The drawings described below are merely a part of the embodiments of the present disclosure. Based on these drawings, those skilled in the art can obtain other drawings without any creative effort.

DESCRIPTION OF EMBODIMENTS

Figure 1:
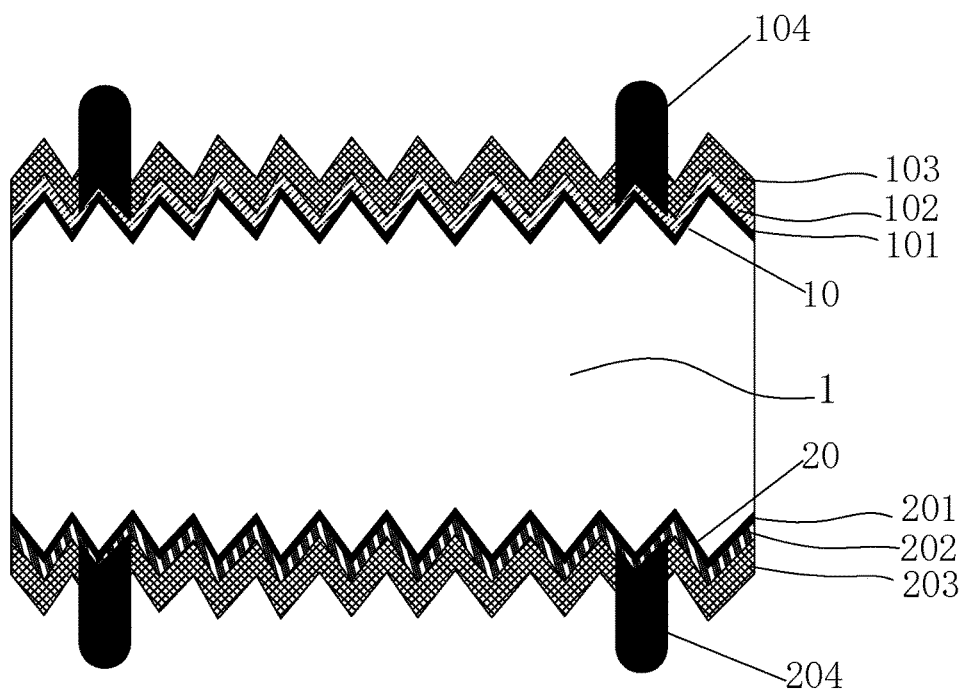
FIG. 1 is a structural schematic diagram showing an N-type passivation contact solar cell according to an exemplary embodiment of the present disclosure.

In order to better understand objects, technical solutions and advantages of the present disclosure, the present disclosure is further described in details with reference to the accompanying drawings and embodiments. It should be understood that the specific embodiments described here are only used to explain the present disclosure, but not to limit the present disclosure.

It should be understood that the term "and/or" used in the context of the present disclosure is to describe a correlation relation of related objects, indicating that there may be three relations, e.g., A and/or B may indicate only A, both A and B, and only B.

It should be understood that the orientation terminologies, such as, "on" and "under", described in the embodiments of the present disclosure are described according to the angle shown in the drawings, and should not be construed as limiting the embodiments of the present disclosure. In addition, it should also be understood that when one element is "on" or "under" another element, the one element not only can be directly "on" or "under" another element, the one element can also be indirectly "on" or "under" another element through an intermediate element. The terms "a", "an", "the" and "said" in a singular form in the embodiments of the present disclosure and the appended claims are also intended to include plural forms thereof, unless indicated otherwise.

In order to overcome shortcomings of the prior art, the present disclosure provides a solar cell and a photovoltaic module including the solar cell, in order to reduce light absorption loss, improve conversion efficiency of the cell, and increase an open-circuit voltage and a short-circuit current of the cell.

In view of this, referring to FIG. 1 to FIG. 6, in some embodiments of the present disclosure, a solar cell is provided. The solar cell includes: a semiconductor substrate including a first surface 10 and a second surface 20 that are opposite to each other; a first dielectric layer 101 located on the first surface 10; a first N+ doped layer 102 located on a surface of the first dielectric layer 101; a first passivation layer 103 located on a surface of the first N+ doped layer 102; a first electrode 104 located on a surface of the first passivation layer 103; a second dielectric layer 201 located on the second surface 20; a first P+ doped layer 202 located on a surface of the second dielectric layer 201; a second passivation layer 203 located on a surface of the first P+ doped layer 202; and a second electrode 204 located on a surface of the second passivation layer 203.

The first passivation layer 103 may be referred to as a first anti-reflection layer, and the second passivation layer 203 may be referred to as a second anti-reflection layer. To some extent, the first passivation layer 103 or the second passivation layer 203 may be used to achieve the anti-reflection effect. Generally in the art, a passivation layer on the substrate mainly functions to passivate dangling bonds of the surface of the substrate and prevent recombination of carriers in a surface region. An anti-reflection layer may have partial passivation effect, but as it is generally located on the passivation layer and is far away from the surface of the silicon substrate, a main purpose of the anti-reflection layer is to adjust a refractive index of the overall light-transmitting layer to achieve anti-reflection effect of increasing light absorption. Meanwhile, the anti-reflection layer can further protect the solar cell, improve weather resistance, and avoid efficiency degradation caused by defects of the cell resulting from substances such as oxygen, water, and metal ions entering the solar cell from the external environment. Therefore, when determining the structure of the surface layer, the layer that is mainly used for passivation and close to the surface of the silicon substrate is determined as a passivation layer, and the layer that is located on the passivation layer is determined as an anti-reflection layer. For example, if the surface structure of the cell is silicon substrate surface/silicon oxide/silicon nitride, then the silicon oxide should be regarded as a passivation layer, and the silicon nitride should be regarded as an anti-reflection layer. Similarly, in passivation structures of aluminum oxide/silicon nitride, silicon oxide/silicon oxynitride, and aluminum oxide/silicon oxynitride, the aluminum oxide and the silicon oxide should be regarded as a passivation layer, and the silicon nitride and the silicon oxynitride should be regarded as an anti-reflection layer. In the structure of silicon oxide/aluminum oxide/silicon nitride, since aluminum oxide contains high-density negative charges that play a role of field passivation, the silicon oxide/aluminum oxide is regarded as a passivation layer, and the silicon nitride is regarded as an anti-reflection layer.

With the configuration of the embodiments of the present disclosure, a double-side passivation contact effect can be achieved in the solar cell. With the aid of the substrate material, a lower lateral transmission resistance can be achieved. That is, the material of the substrate can be used to assist in lateral transmission of carriers, alleviating a compromise restriction between lateral transmission and light absorption of a polycrystalline silicon film when a passivation contact structure is applied to the front side of the cell. Therefore, an open-circuit voltage and a short-circuit current can be increased, and a light absorption problem caused by the existing ITO or thick polycrystalline silicon can be avoided.

The semiconductor substrate may be a crystalline silicon substrate (silicon substrate), such as a polycrystalline silicon substrate, a monocrystalline silicon substrate, or a monocrystalline silicon-like substrate, etc. The present disclosure does not limit the type of the semiconductor substrate.

The first surface 10 may be a back surface of the semiconductor substrate, and the second surface 20 may be a front surface of the semiconductor substrate. Alternatively, the first surface 10 may be a front surface of the semiconductor substrate, and the second surface 20 may be a back surface of the semiconductor substrate.

In some embodiments of the present disclosure, the front surface of the semiconductor substrate is a surface facing the sun, that is, a surface to be irradiated by sunlight, and the back surface of the semiconductor substrate is a surface facing away from the sun.

The semiconductor substrate may be P-doped or N-doped, that is, the semiconductor substrate may be a P-type semiconductor substrate or an N-type semiconductor substrate. The solar cell according to the embodiments of the present disclosure may be a double-side passivation contact P-type solar cell, or a double-side passivation contact N-type solar cell.

Hereinafter, the double-side passivation contact N-type solar cell and the double-side passivation contact P-type solar cell will be described clearly and completely in combination with the drawings of the present disclosure. The described embodiments are merely part of the embodiments of the present disclosure rather than all of the embodiments. All other embodiments obtained by those skilled in the art based on the embodiments of the present disclosure without paying creative effort shall fall into the protection scope of the present disclosure.

[N-type Solar Cell]

Figure 2:
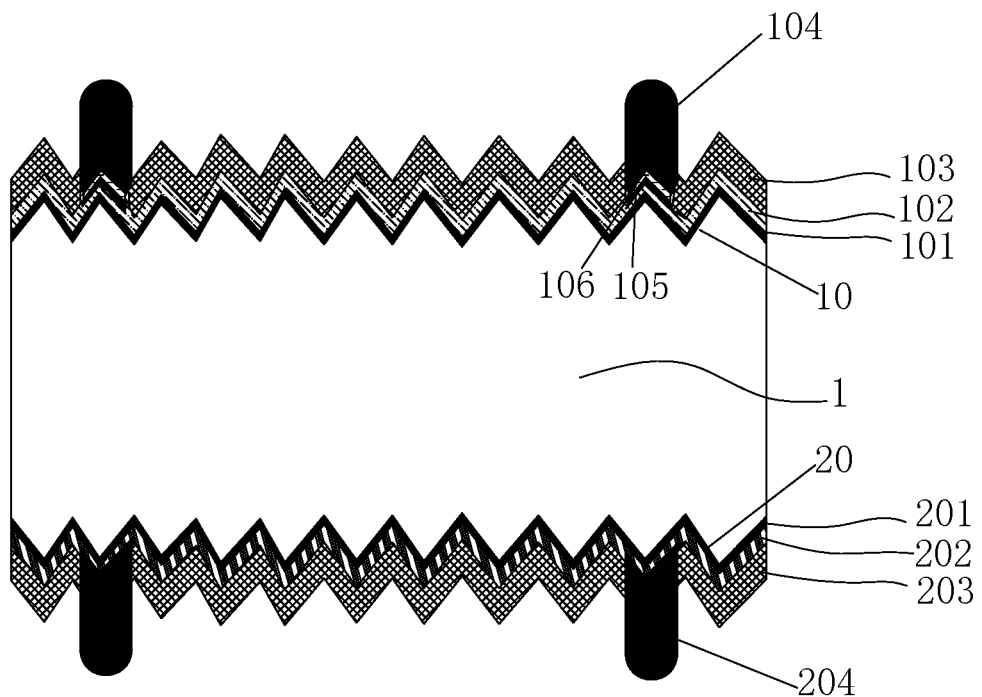
FIG. 2 is a structural schematic diagram showing an N-type passivation contact solar cell according to another exemplary embodiment of the present disclosure.
Figure 3:
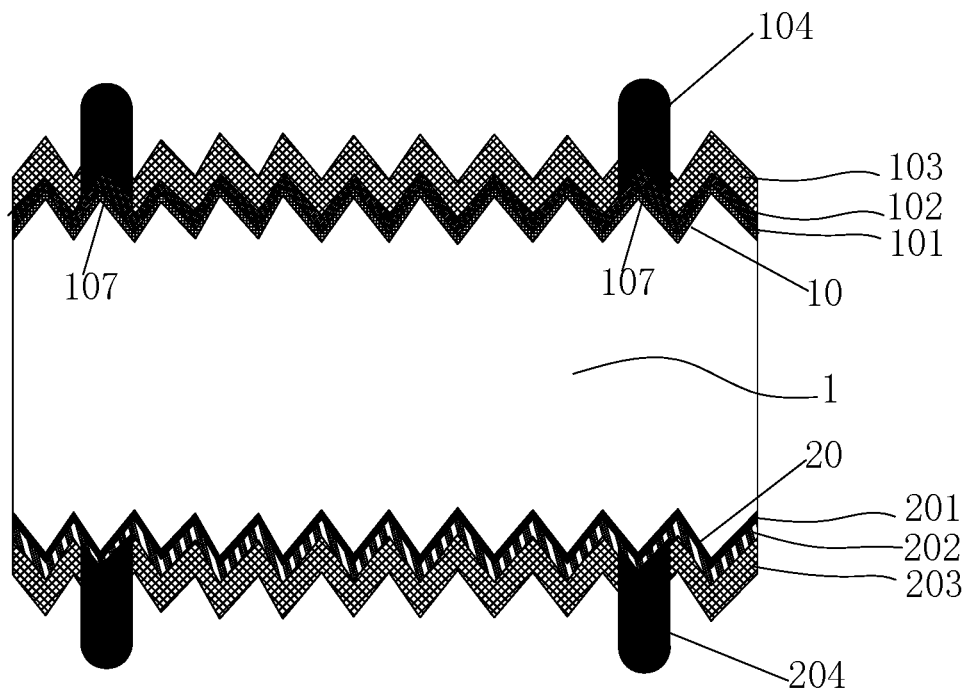
FIG. 3 is a structural schematic diagram showing an N-type passivation contact solar cell according to still another exemplary embodiment of the present disclosure.

Referring to FIGS. 1-3, some embodiments of the present disclosure provides a solar cell, i.e., a double-side passivation contact N-type solar cell, including an N-type semiconductor substrate 1.

The N-type semiconductor substrate 1 includes a first surface 10 and a second surface 20 that are opposite to each other. The first surface 10 is a front surface of the semiconductor substrate, and the second surface 20 is a back surface of the semiconductor substrate.

A first dielectric layer 101, a first N+ doped layer 102, a first passivation layer 103, and a first electrode 104 are sequentially provided on the front surface of the N-type semiconductor substrate 1.

A second dielectric layer 201, a first P+ doped layer 202, a second passivation layer 203, and a second electrode 204 are sequentially provided on the back surface of the N-type semiconductor substrate 1.

The double-side passivation contact N-type solar cell is a back junction double-side passivation contact N-type solar cell, in which the first N+ doped layer 102 on the front surface and the N-type semiconductor substrate 1 (N-type silicon substrate) form an N+N junction. In a case where the first N+ doped layer is ultra-thin, a lower lateral transmission resistance is achieved with the aid of the N-type silicon substrate. Moreover, the first P+ doped layer 202 is provided on the back surface to form a back emitter, and a thicker P+ doped layer 202 (e.g., a conventional thickness of the P+ doped layer) can be adopted without affecting light absorption of the cell. The N+N junction refers to a high-low junction formed by an N+ doped semiconductor material layer heavily doped and an N-type semiconductor substrate.

Therefore, in the back junction double-side passivation contact N-type solar cell according to the embodiments of the present disclosure, the N+N high-low junction can assist in the lateral transmission of carriers by means of the substrate material, and a front-side passivation contact can be achieved with a ultra-thin doped polycrystalline silicon having a high square resistance, which can avoid the light absorption problem of the existing ITO or a thick doped polycrystalline silicon, and alleviate a compromise restriction between lateral transmission and light absorption of a polycrystalline silicon film when the passivation contact structure is applied to the front side of the cell, thereby increasing a short-circuit current of the cell while achieving a high open-circuit voltage. Moreover, a burn-through damage to the ultra-thin passivation contact caused by the high-temperature metal slurry is also alleviated. For example, at least two passivation contact structures (e.g., the passivation contact structure illustrated in FIG. 2 or FIG. 3) can be used for forming a front-side emission junction.

In some embodiments of the present disclosure, each of the front and back surfaces of the N-type semiconductor substrate 1 may be a textured surface with extremely uneven surface morphology. The textured surface may include a perforated rough surface formed through regular pyramid, inverted pyramid, reactive ion etching (RIE) or Metal Catalyst Assisted Texturing (MCT).

In some embodiments of the present disclosure, the surface of the semiconductor substrate has a textured structure formed through texturing, which produces a light trapping effect, and increases the amount of light absorbed by the solar cell, improving conversion efficiency of the solar cell.

In some embodiments of the present disclosure, a thickness of the N-type semiconductor substrate 1 may be in a range from 100 μm to 300 μm, optionally in a range from 100 μm to 250 μm, more optionally in a range from 120 μm to 240 μm, e.g., 100 μm, 120 μm, 150 μm, 180 μm, 200 μm, 240 μm, 250 μm, 280 μm, 300 μm, or other values within these ranges, which are not limited herein.

The specific types of the first dielectric layer 101 and the second dielectric layer 201 are varied and can be selected according to actual requirements, which is not limited in the present disclosure. For example, in some embodiments of the present disclosure, the first dielectric layer 101 may include at least one of silicon oxide, hafnium oxide, titanium oxide, silicon nitride, silicon oxynitride, or aluminum oxide. For example, the first dielectric layer 101 may be a silicon dioxide dielectric layer, a silicon nitride dielectric layer, an aluminum oxide dielectric layer, a hafnium oxide dielectric layer, a titanium oxide dielectric layer, or a silicon oxynitride dielectric layer, or other dielectric layers known or newly developed in the art. For example, in some other embodiments of the present disclosure, the first dielectric layer 101 may also be a dielectric layer doped with phosphorus or other elements.

Accordingly, in some embodiments of the present disclosure, the second dielectric layer 201 includes at least one of silicon oxide, hafnium oxide, titanium oxide, silicon nitride, silicon oxynitride, or aluminum oxide. For example, the second dielectric layer 201 may be a silicon dioxide dielectric layer, a silicon nitride dielectric layer, an aluminum oxide dielectric layer, a hafnium oxide dielectric layer, a titanium oxide dielectric layer, or a silicon oxynitride dielectric layer, or other dielectric layers known or newly developed in the art. For example, in some other embodiments of the present disclosure, the second dielectric layer 201 may be a dielectric layer doped with other elements.

In some embodiments of the present disclosure, the first dielectric layer 101 may be a tunnel oxide layer, and the second dielectric layer 201 may be a tunnel oxide layer.

In some embodiments of the present disclosure, a thickness of the first dielectric layer 101 may be in a range from 0.5 nm to 3 nm, optionally in a range from 1.0 nm to 2.5 nm, e.g., 0.5 nm, 0.8 nm, 1 nm, 1.5 nm, 2 nm, 2.5 nm, or 3 nm, etc.

In some embodiments of the present disclosure, a thickness of the second dielectric layer 201 may be in a range from 0.5 nm to 3 nm, optionally in a range from 1.0 nm to 2.5 nm, e.g., 0.5 nm, 0.8 nm, 1 nm, 1.5 nm, 2 nm, 2.5 nm, or 3 nm, etc.

The first dielectric layer 101 and second dielectric layer 201 are required to have tunnel effect that allows carriers in the substrate to enter the first N+ doped layer 102 and the first P+ doped layer 202 (i.e., the doped polycrystalline silicon layers as illustrated below) while having a passivation effect on the surface of the semiconductor substrate. When the thickness of the dielectric layer is too small, the passivation effect cannot be achieved. When the thickness of the dielectric layer is too large, the carriers cannot tunnel through the doped polycrystalline silicon layers effectively.

In this N-type solar cell, a PN junction is located at the back side of the cell, that is, a back junction structure design is used. The first N+ doped layer 102 and the N-type semiconductor substrate 1 form an N+N high-low junction at the front side of the cell. With the passivation contact structures on both the front and back sides of the cell, it is beneficial to increase the open-circuit voltage of the cell and increase the short-circuit current. The first N+ doped layer 102 may be, but is not limited to, a first N+ doped polycrystalline silicon layer, in which a dopant doped may be, for example, N-type elements such as phosphorus, arsenic, and antimony. The first P+ doped layer 202 may be, but is not limited to, a first P+ doped polycrystalline silicon layer, in which a dopant doped may be, for example, P-type elements such as boron, indium, gallium, and aluminum.

In some embodiments of the present disclosure, a doping concentration of the first N+ doped layer 102 may be in a range from $5\times10^{19}$ cm$^{-3}$ to $6\times10^{20}$ cm$^{-3}$, e.g., $5\times10^{19}$ cm$^{-3}$, $6\times10^{19}$ cm$^{-3}$, $7\times10^{19}$ cm$^{-3}$, $8\times10^{19}$ cm$^{-3}$, $9\times10^{19}$ cm$^{-3}$, $1\times10^{20}$ cm$^{-3}$, $2\times10^{20}$ cm$^{-3}$, $4\times10^{20}$ cm$^{-3}$, $5\times10^{20}$ cm$^{-3}$, $6\times10^{20}$ cm$^{-3}$, or other values within the range.

In some embodiments of the present disclosure, a thickness of the first N+ doped layer 102 may be in a range from 5 nm to 30 nm, e.g., 5 nm, 8 nm, 10 nm, 15 nm, 18 nm, 20 nm, 22 nm, 25 nm, 30 nm, or other values within the range.

With the doping concentration of the first N+ doped layer 102 controlled within the above range, the manufactured solar cell can meet its performance requirements, improving photoelectric conversion efficiency of the solar cell and performance of the solar cell. Moreover, with a relatively small thickness of the first N+ doped layer 102, optionally in a range from 5 nm to 30 nm, an ultra-thin doped polycrystalline silicon having a high square resistance, when used for passivation and contact, can avoid the light absorption problem of the existing ITO or thick polycrystalline silicon.

In some embodiments of the present disclosure, a doping concentration of the first P+ doped layer 202 may be in a range from $5\times10^{19}$ cm$^{-3}$ to $6\times10^{20}$ cm$^{-3}$. For example, the doping concentration of the first P+ doped layer 202 may be $5\times10^{19}$ cm$^{-3}$, $6\times10^{19}$ cm$^{-3}$, $7\times10^{19}$ cm$^{-3}$, $8\times10^{19}$ cm$^{-3}$, $9\times10^{19}$ cm$^{-3}$, $1\times10^{20}$ cm$^{-3}$, $2\times10^{20}$ cm$^{-3}$, $4\times10^{20}$ cm$^{-3}$, $5\times10^{20}$ cm$^{-3}$, $6\times10^{20}$ cm$^{-3}$, or other values within this range.

In some embodiments of the present disclosure, a thickness of the first P+ doped layer 202 may be in a range from 80 nm to 300 nm, e.g., 80 nm, 100 nm, 150 nm, 180 nm, 200 nm, 220 nm, 250 nm, 280 nm, 300 nm, or other values within this range.

With the dopant concentration of the first P+ doped layer 202 controlled within the above range, the manufactured solar cell can meet its performance requirements, improving photoelectric conversion efficiency of the solar cell and performance of the solar cell. Moreover, since the thickness of the first P+ doped layer 202 is moderate, optionally in a range from 80 nm to 300 nm, a relatively thick P+ doped polycrystalline silicon layer can be adopted to form a back side emitter with the N-type silicon substrate at the back side of the cell, without affecting light absorption of the cell.

In some embodiments of the present disclosure, the first passivation layer 103 includes, but is not limited to, a stacked structure formed by one or more of silicon nitride, silicon oxide, silicon oxynitride, or silicon carbide. The stacked structure refers to a structure that includes a plurality of sub-layers, each sub-layer including one or more of silicon nitride, silicon oxide, silicon oxynitride, or silicon carbide. It is noted that, the first passivation layer and the first anti-reflection layer may also be made of other types of materials such as aluminum oxide and amorphous silicon. In some embodiments of the present disclosure, the first passivation layer 103 may include a first passivation sub-layer that mainly plays a role of passivation and a first anti-reflection sub-layer that mainly plays a role of anti-reflection.

In some embodiments of the present disclosure, the second passivation layer 203 includes, but is not limited to, a stacked structure formed by one or more of silicon nitride, silicon oxide, silicon oxynitride, or silicon carbide. Herein, the stacked structure refers to a structure that includes a plurality of sub-layers, each sub-layer including one or more of silicon nitride, silicon oxide, silicon oxynitride, or silicon carbide. It is noted that, the second passivation layer and the second anti-reflection layer may also be made of other types of materials such as aluminum oxide and amorphous silicon.

According to the embodiments of the present disclosure, the first passivation layer (or referred to as a first passivation layer in some embodiments) is a front-side passivation layer (or referred to as a front-side anti-reflection layer in some embodiments). The front-side passivation layer can be composed of stacked films. The stacked film may include aluminum oxide, silicon oxide, silicon oxynitride, silicon nitride, gallium oxide, silicon carbide, amorphous silicon, silicon oxycarbide, or the like, or any combinations thereof. In addition, the front-side passivation layer may contain materials of other types, which are not limited in the present disclosure. The passivation layer mentioned above has a good passivation effect on the semiconductor substrate, and is beneficial to improve conversion efficiency of the cell. A purpose of providing the anti-reflection layer is, on the one hand, to reduce reflection of light and increase amount of light absorbed by the solar cell, and on the other hand, to have a passivation effect, thereby improving efficiency of the solar cell. Correspondingly, the second passivation layer mentioned above (or referred to as a second anti-reflection layer in some embodiments) is a back-side passivation layer (or referred to as a back-side anti-reflection layer in some embodiments). Similarly, the back-side passivation layer may be composed of stacked films, and the stacked film may include aluminum oxide, silicon oxide, silicon oxynitride, silicon nitride, gallium oxide, silicon carbide, amorphous silicon, silicon oxycarbide, or the like, or any combination thereof, which is not limited herein.

The back-side passivation layer and the back-side reflection layer may be understood in the same way as the front-side structures (i.e., the front-side passivation layer and the front-side anti-reflection layer), in terms of their main roles and functions, which will not be repeated here.

In some embodiments of the present disclosure, a thickness of the first passivation layer 103 may be in a range from 70 nm to 180 nm, e.g., 70 nm, 80 nm, 90 nm, 100 nm, 120 nm, 140 nm, 150 nm, 160 nm, 180 nm, or other values within this range.

In some embodiments of the present disclosure, a thickness of the second passivation layer 203 may be in a range from 70 nm to 180 nm, e.g., 70 nm, 80 nm, 90 nm, 100 nm, 120 nm, 140 nm, 150 nm, 160 nm, 180 nm, or other values within this range.

With the thicknesses of the passivation layer (or referred to as the anti-reflection layer) within the ranges mentioned above, it is beneficial to have a good passivation effect and an anti-reflection effect.

The first electrode 104 mentioned above is a metal electrode composed of a conductive material. The first electrode 104 penetrates through the front-side anti-reflection layer and the front-side passivation layer to be in contact with the first N+ doped layer, and is configured to collect and export photocarriers. The second electrode 204 mentioned above is a metal electrode composed of a conductive material. The second electrode 204 penetrates through the back-side reflection layer and the back-side passivation layer to in contact with the first P+ doped layer, and is configured to collect and export photocarriers. It should be noted that the materials of the first electrode 104 and the second electrode 204 are not limited in the present disclosure, and may be, for example, a silver electrode, an aluminum electrode, or a silver-aluminum electrode.

As shown in FIG. 2, based on the embodiments mentioned above, the double-side passivation contact N-type solar cell further includes a third dielectric layer 105 and a second N+ doped layer 106. In some embodiments of the present disclosure, at least one region on the surface of the first N+ doped layer 102 is sequentially provided with a third dielectric layer 105 and a second N+ doped layer 106, and the first electrode 104 penetrates through the first passivation layer 103 to be in contact with the second N+ doped layer 106. The at least one region on the surface of the first N+ doped layer 102 corresponds to a region of the first electrode 104. For example, each of the at least one region on the surface of the first N+ doped layer 102 corresponds to a region of one first electrode 104.

In this double-side passivation contact N-type solar cell, a region corresponding to the first electrode 104 is provided with the third dielectric layer 105 and the second N+ doped layer 106, which not only increases the open-circuit voltage and short-circuit current, but also helps to solve the burn-through damage problem of the ultra-thin passivation contact caused by the high-temperature metal slurry.

In some embodiments of the present disclosure, the third dielectric layer 105 includes, but is not limited to, at least one of silicon oxide, hafnium oxide, titanium oxide, silicon nitride, silicon oxynitride, or aluminum oxide. For example, the third dielectric layer 105 may be a silicon dioxide dielectric layer, a silicon nitride dielectric layer, an aluminum oxide dielectric layer, a hafnium oxide dielectric layer, a titanium oxide dielectric layer, or a silicon oxynitride dielectric layer, or other dielectric layers known or newly developed in the art.

It should be noted that the method of forming the dielectric layer is not limited in the present disclosure. For example, a method of forming the first dielectric layer and the third dielectric layer includes, but is not limited to, any one or more of chemical vapor deposition method, high-temperature thermal oxygen oxidation method, and nitric acid oxidation method.

In some embodiments of the present disclosure, a thickness of the third dielectric layer 105 may be in a range from 0.5 nm to 3 nm, optionally in a range from 1.0 nm to 2.5 nm, e.g., 0.5 nm, 0.8 nm, 1 nm, 1.5 nm, 2 nm, 2.5 nm, or 3 nm.

In some embodiments of the present disclosure, a thickness of the second N+ doped layer 106 may be in a range from 50 nm to 150 nm, e.g., 50 nm, 60 nm, 70 nm, 80 nm, 90 nm, 100 nm, 120 nm, 140 nm, 150 nm, or other values within this range. The thickness of the second N+ doped layer 106 is required to be greater than that of the first N+ doped layer, in order to meet performance requirements of the solar cell and improve performance of the solar cell.

It should be noted that the method of forming the N+ doped layer is not limited in the present disclosure. For example, a method of forming the first N+ doped layer 102 and the second N+ doped layer 106 includes, but is not limited to, chemical vapor deposition (CVD), physical vapor deposition (PVD), or atomic layer deposition (ALD), e.g., plasma enhanced chemical vapor deposition (PECVD), low pressure chemical vapor deposition (LPCVD), or the like. In addition, the third dielectric layer and the second N+ doped layer can be formed by means of a patterned mask.

As shown in FIG. 3, based on the embodiments mentioned above, the double-side passivation contact N-type solar cell may further have a thickened N+ doped region 107. In some embodiments of the present disclosure, at least one region of the first N+ doped layer 102 is formed as a thickened N+ doped region 107, and the first electrode 104 penetrates through the first passivation layer 103 to be in contact with the thickened N+ doped region 107. The at least one region of the first N+ doped layer 102 corresponds to a region of the first electrode 104.

In this double-side passivation contact N-type solar cell, a region corresponding to the first electrode 104 is provided with the thickened N+ doped region 107, which not only increases the open-circuit voltage and short-circuit current, but also helps to solve a burn-through damage problem of the ultra-thin passivation contact caused by the high-temperature metal slurry.

In some embodiments of the present disclosure, a thickness of the thickened N+ doped region 107 may be in a range from 80 nm to 200 nm, e.g., 80 nm, 90 nm, 100 nm, 120 nm, 140 nm, 150 nm, 160 nm, 180 nm, 200 nm, or other values within this range.

It can be understood that the first N+ doped layer 102 may have an N+ doped region with a normal thickness and a thickened N+ doped region 107. The normal thickness of the N+ doped region may be in a range from 5 nm to 30 nm. The thickness of the thickened N+ doped region 107 may be in a range from 80 nm to 200 nm. The thickness of the thickened N+ doped region corresponds to a region of the first electrode.

[P-type Solar Cell]

Figure 4:
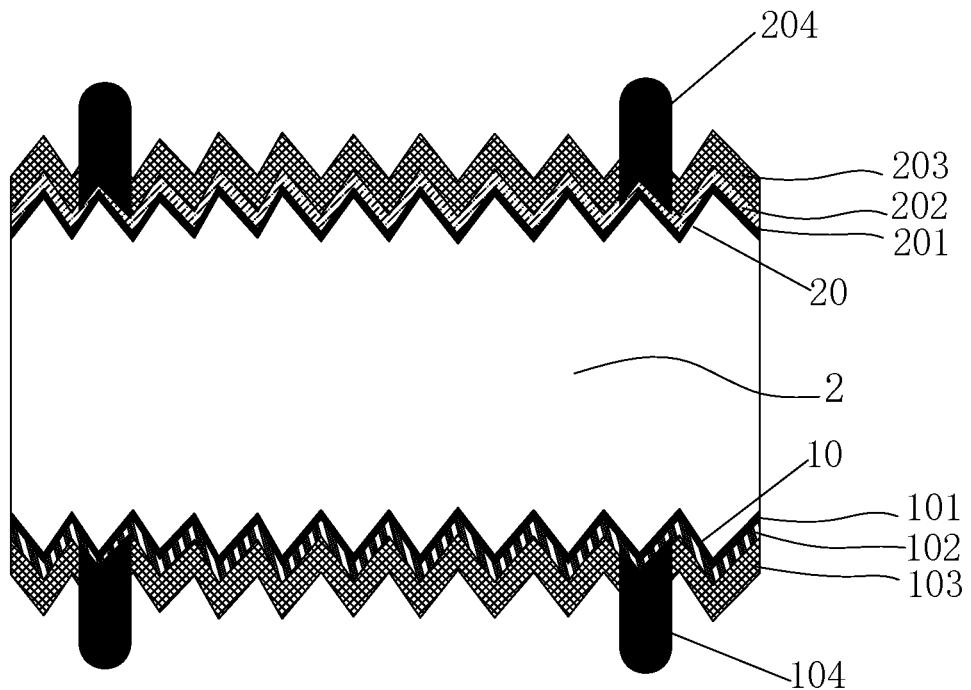
FIG. 4 is a structural schematic diagram showing a P-type passivation contact solar cell according to an exemplary embodiment of the present disclosure.
Figure 5:
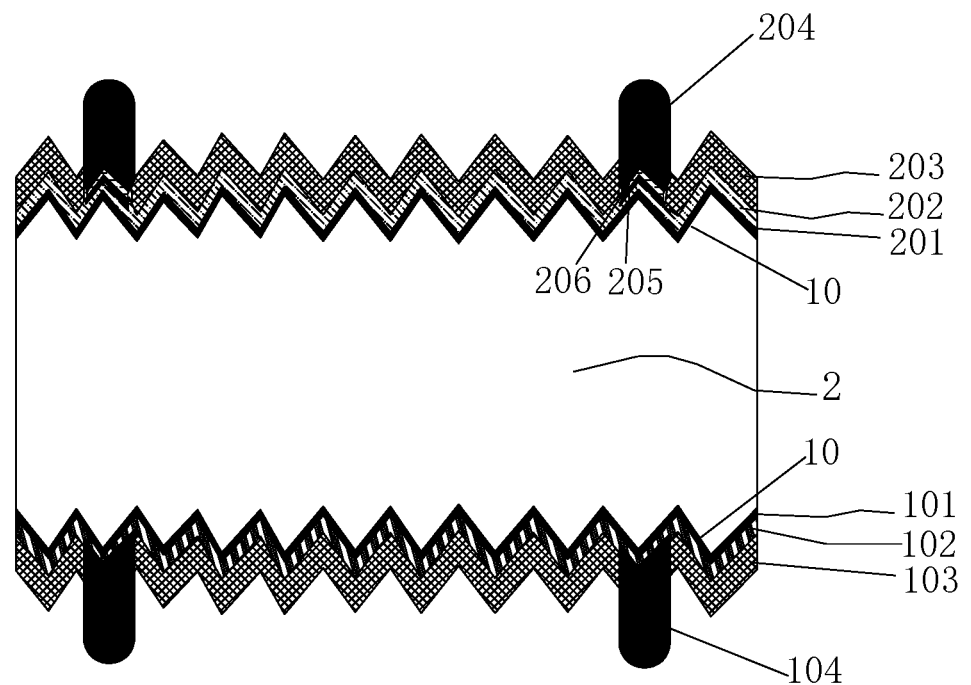
FIG. 5 is a structural schematic diagram showing a P-type passivation contact solar cell according to another exemplary embodiment of the present disclosure.
Figure 6:
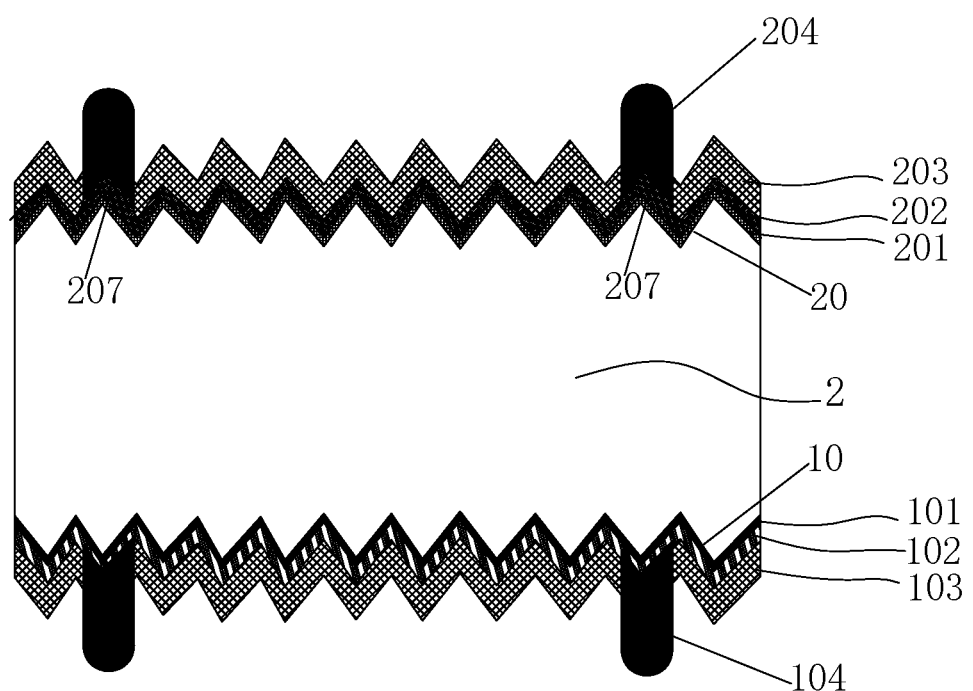
FIG. 6 is a structural schematic diagram showing a P-type passivation contact solar cell according to still another exemplary embodiment of the present disclosure.

Referring to FIGS. 4-6, some embodiments of the present disclosure provides a solar cell, i.e., a double-side passivation contact P-type solar cell, including a P-type semiconductor substrate 2.

The P-type semiconductor substrate 2 includes a first surface 10 and a second surface 20 that are opposite to each other. The first surface 10 is a back surface of the semiconductor substrate, and the second surface 20 is a front surface of the semiconductor substrate.

A second dielectric layer 201, a first P+ doped layer 202, a second passivation layer 203, and a second electrode 204 are sequentially provided on the front surface of the P-type semiconductor substrate 2.

A first dielectric layer 101, a first N+ doped layer 102, a first passivation layer 103, and a first electrode 104 are sequentially provided on the back surface of the P-type semiconductor substrate 2.

The double-side passivation contact P-type solar cell is a back junction double-side passivation contact P-type solar cell, in which the first P+ doped layer 202 on the front surface and the P-type semiconductor substrate 2 (P-type silicon substrate) form an P+P junction. In a case where the first P+ doped layer is ultra-thin, a lower lateral transmission resistance is achieved with the aid of the P-type silicon substrate. Moreover, the first N+ doped layer 102 is used on the back surface to form a back emitter, and a thicker N+ doped layer (e.g., with a conventional thickness of the N+ doped layer) may not be adopted without affecting light absorption of the cell. The P+P junction refers to a high-low junction formed by a P+ doped semiconductor material layer heavily doped and a P-type semiconductor substrate.

Therefore, in the back junction double-side passivation contact P-type solar cell according to the embodiments of the present disclosure, the P+P high-low junction can assist in the lateral transmission of carriers by means of the substrate material, and a front-side passivation contact can be achieved using an ultra-thin doped polycrystalline silicon having a high square resistance, which avoids the light absorption of the existing ITO or thick doped polycrystalline silicon, and alleviates a compromise restriction between lateral transmission and light absorption of a polycrystalline silicon film when a passivation contact structure is applied to the front side of the cell, thereby increasing a short-circuit current of the cell while achieving a high open-circuit voltage. In addition, the burn-through damage problem of the ultra-thin passivation contact caused by the high-temperature metal slurry is also alleviated. For example, at least two passivation contact structures (e.g., the passivation contact structure illustrated in FIG. 5 or FIG. 6) can be used for forming a front-side emission junction.

In some embodiments of the present disclosure, each of the front and back surfaces of the P-type semiconductor substrate 2 may be a textured surface with extremely uneven surface morphology. The textured surface may include a perforated rough surface manufactured by a method of regular pyramid, inverted pyramid, reactive ion etching (RIE) or Metal Catalyst Assisted Texturing (MCT). In some embodiments of the present disclosure, the surface of the semiconductor substrate has a textured structure formed through texturing, which produces a light trapping effect, and increases the amount of light absorbed by the solar cell, improving conversion efficiency of the solar cell.

In some embodiments of the present disclosure, a thickness of the P-type semiconductor substrate 2 may be in a range from 100 μm to 300 μm, optionally in a range from 100 μm to 250 μm, more optionally in a range from 120 μm to 240 μm, e.g., 100 μm, 120 μm, 150 μm, 180 μm, 200 μm, 240 μm, 250 μm, 280 μm, 300 μm, or other values within these ranges, which are not limited herein.

In this P-type solar cell, the specific types of the second dielectric layer 201 and the first dielectric layer 101 are not limited in the present disclosure, and can be selected according to actual requirements. In some embodiments of the present disclosure, the second dielectric layer 201 and the first dielectric layer 101 each include, but are not limited to, at least one of silicon oxide, hafnium oxide, titanium oxide, silicon nitride, silicon oxynitride, or aluminum oxide. For example, it can be a silicon dioxide dielectric layer, a silicon nitride dielectric layer, an aluminum oxide dielectric layer, a hafnium oxide dielectric layer, a titanium oxide dielectric layer, or a silicon oxynitride dielectric layer, or other dielectric layers known or newly developed in the art. In addition, in some embodiments of the present disclosure, the second dielectric layer 201 and the first dielectric layer 101 may be dielectric layers doped with phosphorus or other elements.

In some embodiments of the present disclosure, the second dielectric layer 201 may be a tunnel oxide layer, and the first dielectric layer 101 may be a tunnel oxide layer.

In some embodiments of the present disclosure, a thickness of the second dielectric layer 201 may be in a range from 0.5 nm to 3 nm, optionally in a range from 1.0 nm to 2.5 nm, e.g., 0.5 nm, 0.8 nm, 1 nm, 1.5 nm, 2 nm, 2.5 nm, or 3 nm. A thickness of the first dielectric layer 101 may be in a range from 0.5 nm to 3 nm, optionally in a range from 1.0 nm to 2.5 nm, e.g., 0.5 nm, 0.8 nm, 1 nm, 1.5 nm, 2 nm, 2.5 nm, or 3 nm. The second dielectric layer 201 and the first dielectric layer 101 are required to have tunnel effect that allow carriers in the semiconductor substrate to enter the first P+ doped layer 202 and the first N+ doped layer 102 while having a passivation effect on the surface of the semiconductor substrate. When the thickness of the dielectric layer is too small, the passivation effect cannot be achieved. When the thickness of the dielectric layer is too large, carriers cannot tunnel through the second dielectric layer 201 and the first dielectric layer 101 effectively.

In this P-type solar cell, the PN junction is located at the back side of the cell, that is, a back junction structure design is used. The first P+ doped layer 202 and the P-type semiconductor substrate 2 form a P+P high-low junction at the front side of the cell. The passivation contact structure on both the front and back sides of the cell is beneficial to increase the open-circuit voltage of the cell and increase the short-circuit current. The first P+ doped layer 202 may be, but is not limited to, a first P+ doped polycrystalline silicon layer, in which the dopant doped may be, for example, P-type elements such as boron, indium, gallium, and aluminum. The first N+ doped layer 102 may be, but is not limited to, a first N+ doped polycrystalline silicon layer, in which the dopant doped may be, for example, N-type elements such as phosphorus, arsenic, and antimony.

In some embodiments of the present disclosure, in the P-type solar cell, a doping concentration of the first P+ doped layer 202 may be in a range from $5 \times 10^{19}$ cm$^{-3}$ to $6 \times 10^{20}$ cm$^{-3}$, e.g., $5 \times 10^{19}$ cm$^{-3}$, $6 \times 10^{19}$ cm$^{-3}$, $7 \times 10^{19}$ cm$^{-3}$, $8 \times 10^{19}$ cm$^{-3}$, $9 \times 10^{19}$ cm$^{-3}$, $1 \times 10^{20}$ cm$^{-3}$, $2 \times 10^{20}$ cm$^3$, $4 \times 10^{20}$ cm$^{-3}$, $5 \times 10^{20}$ cm$^{-3}$, $6 \times 10^{20}$ cm$^3$, or other values within this range. In some embodiments of the present disclosure, a thickness of the first P+ doped layer 202 may be in a range from 5 nm to 30 nm, e.g., 5 nm, 8 nm, 10 nm, 15 nm, 18 nm, 20 nm, 22 nm, 25 nm, 30 nm, or other values within this range.

With the dopant concentration of the first P+ doped layer 202 controlled within the above range, the manufactured solar cell can meet its performance requirements, improving photoelectric conversion efficiency of the solar cell and performance of the solar cell. Moreover, the thickness of the first P+ doped layer 202 is relatively small, optionally in a range from 5 nm to 30 nm, and passivation and contact can be achieved by using an ultra-thin doped polycrystalline silicon having a high square resistance, avoiding the light absorption problem of the existing ITO or thick polycrystalline silicon.

In some embodiments of the present disclosure, in the P-type solar cell, a doping concentration of the first N+ doped layer 102 may be in a range from $5 \times 10^{19}$ cm$^{-3}$ to $6 \times 10^{20}$ cm$^{-3}$, e.g., $5 \times 10^{19}$ cm$^{-3}$, $6 \times 10^{19}$ cm$^{-3}$, $7 \times 10^{19}$ cm$^{-3}$, $8 \times 10^{19}$ cm$^{-3}$, $9 \times 10^{19}$ cm$^{-3}$, $1 \times 10^{20}$ cm$^{-3}$, $2 \times 10^{20}$ cm$^{-3}$, $4 \times 10^{20}$ cm$^{-3}$, $5 \times 10^{20}$ cm$^{-3}$, $6 \times 10^{20}$ cm$^{-3}$, or other values within this range. In some embodiments of the present disclosure, a thickness of the first N+ doped layer 102 may be in a range from 80 nm to 300 nm, e.g., 80 nm, 100 nm, 150 nm, 180 nm, 200 nm, 220 nm, 250 nm, 280 nm, 300 nm, or other values within this range.

With the dopant concentration of the first N+ doped layer 102 controlled within the above range, the manufactured solar cell can meet its performance requirements, improving photoelectric conversion efficiency of the solar cell and performance of the solar cell. Moreover, since the thickness of the first N+ doped layer 102 is moderate, optionally in a range from 80 nm to 300 nm, a thicker N+ doped polycrystalline silicon layer can be used to form a back-side emitter with the P-type silicon substrate at the back side of the cell, without affecting light absorption of the cell.

In some embodiments of the present disclosure, in the P-type solar cell, the second passivation layer 203 includes, but is not limited to, a stacked structure formed by one or more of silicon nitride, silicon oxide, silicon oxynitride, or silicon carbide. The stacked structure refers to a structure that includes a plurality of sub-layers, each sub-layer including one or more of silicon nitride, silicon oxide, silicon oxynitride, or silicon carbide. It is noted that, the second passivation layer and the second anti-reflection layer may be made of other types of materials such as aluminum oxide and amorphous silicon. In some embodiments of the present disclosure, the second passivation layer includes a second passivation sub-layer that mainly plays a role of passivation and a second anti-reflection sub-layer that mainly plays a role of anti-reflection.

Correspondingly, the first passivation layer 103 includes, but is not limited to, a stacked structure formed by one or more of silicon nitride, silicon oxide, silicon oxynitride, or silicon carbide. It is noted that, the first passivation layer and the first anti-reflection layer may be made of other types of materials such as aluminum oxide and amorphous silicon.

In the P-type solar cell according to the embodiments of the present disclosure, the second passivation layer is a front-side passivation layer, and the second anti-reflection layer is a front-side anti-reflection layer. The first passivation layer is a back-side passivation layer, and the first anti-reflection layer is a back-side anti-reflection layer. The specific materials, main roles and functions of the front-side passivation layer, the front-side anti-reflection layer, the back-side passivation layer, and the back-side anti-reflection layer can be referred to the description of the corresponding part of the N-type solar cell mentioned above, which will not be repeated here.

In some embodiments of the present disclosure, a thickness of the second passivation layer 203 may be in a range from 70 nm to 180 nm, e.g., 70 nm, 80 nm, 90 nm, 100 nm, 120 nm, 140 nm, 150 nm, 160 nm, 180 nm, or other values within this range. A thickness of the first passivation layer 103 may be in a range from 70 nm to 180 nm, e.g., 70 nm, 80 nm, 90 nm, 100 nm, 120 nm, 140 nm, 150 nm, 160 nm, 180 nm, or other values within this range. The above thickness ranges of the passivation layer and the anti-reflection layer can bring about a good passivation effect and an anti-reflection effect.

As described above, the specific materials of the second electrode 204 and the first electrode 104 are not limited here, and may be, for example, a silver electrode, an aluminum electrode, or a silver-aluminum electrode.

As shown in FIG. 5, based on the embodiments mentioned above, the double-side passivation contact P-type solar cell further includes a fourth dielectric layer 205 and a second P+ doped layer 206. In some embodiments of the present disclosure, at least one region on the surface of the first P+ doped layer 202 is further provided with a fourth dielectric layer 205 and a second P+ doped layer 206, and the second electrode 204 penetrates through the second passivation layer 203 to be in contact with the second P+ doped layer 206. The at least one region on the surface of the first P+ doped layer 202 corresponds to a region of the second electrode 204. For example, each of at least one region on the surface of the first P+ doped layer 202 corresponds to a region of one second electrode 204.

In this double-side passivation contact P-type solar cell, a region corresponding to the second electrode 204 is provided with the fourth dielectric layer 205 and the second P+ doped layer 206, which not only increases the open-circuit voltage and short-circuit current, but also helps to solve a burn-through damage problem of the ultra-thin passivation contact caused by the high-temperature metal slurry.

In some embodiments of the present disclosure, the fourth dielectric layer 205 includes at least one of silicon oxide, hafnium oxide, titanium oxide, silicon nitride, silicon oxynitride, or aluminum oxide. A thickness of the fourth dielectric layer 205 may be in a range from 0.5 nm to 3 nm.

The fourth dielectric layer 205 is similar to the third dielectric layer 105 mentioned above. The specific type and forming method of the fourth dielectric layer 205 can be referred to the description of the third dielectric layer 105 mentioned above, which will not be elaborated here.

In some embodiments of the present disclosure, a thickness of the second P+ doped layer 206 may be in a range from 50 nm to 150 nm, e.g., 50 nm, 60 nm, 70 nm, 80 nm, 90 nm, 100 nm, 120 nm, 140 nm, 150 nm, or other values within this range. The thickness of the second P+ doped layer 206 is required to be greater than the thickness of the first P+ doped layer 202, which is beneficial to meet performance requirements of the solar cell and improve performance of the solar cell.

As shown in FIG. 6, based on the embodiments mentioned above, the double-side passivation contact P-type solar cell may further have a thickened P+ doped region 207. In some embodiments of the present disclosure, at least one region of the first P+ doped layer 202 is formed as the thickened P+ doped region 207, and the second electrode 204 penetrates through the second passivation layer 203 to be in contact with the thickened P+ doped region 207. The at least one region of the first P+ doped layer 202 corresponds to a region of the second electrode 204.

In this structure of the double-side passivation contact P-type solar cell, a region corresponding to the second electrode 204 is provided with the thickened P+ doped region 207, which not only increases the open-circuit voltage and short-circuit current, but also a helps to solve the burn-through damage problem of the ultra-thin passivation contact caused by the high-temperature metal slurry.

In some embodiments of the present disclosure, a thickness of the thickened P+ doped region 207 may be in a range from 80 nm to 200 nm, e.g., 80 nm, 90 nm, 100 nm, 120 nm, 140 nm, 150 nm, 160 nm, 180 nm, 200 nm, or other values within this range.

It can be understood that the first P+ doped layer 202 may have a P+ doped region with a normal thickness and a thickened P+ doped region 207. The normal thickness of the P+ doped region may be in a range from 5 nm to 30 nm. The thickness of the thickened P+ doped region 207 may be in a range from 80 nm to 200 nm. The thickness of the thickened P+ doped region corresponds to a region of the second electrode.

Embodiments of the present disclosure also provide a photovoltaic module including solar cells mentioned above, and at least part of the solar cells is connected to each other in a splicing or stacking manner and sealed by an encapsulating material.

In some embodiments of the present disclosure, the photovoltaic module is formed by a plurality of solar cells which is located in the same plane and electrically connected to each other with a gap (small gap) or without gap. In some embodiments of the present disclosure, the photovoltaic module is formed by a plurality of solar cells which is electrically connected to each other in a stacking manner (that is, located in different planes). The solar cell can be any cell as described in FIGS. 1-6.

Those skilled in the art can understand that the photovoltaic module and the solar cell mentioned above are based on the same invention concept. The features and advantages described above for the solar cell can also apply to the photovoltaic module of the present disclosure. Therefore, the photovoltaic module at least has the same features and advantages as the solar cells mentioned above, which will not be elaborated here.

For example, the photovoltaic module may sequentially include, from bottom to top, a back plate, an encapsulating material, a cell string, an encapsulating material, and glass. The encapsulating material can be EVA, POE, and other encapsulating film materials well-known in the art. The cell string may be formed by the solar cells mentioned above in a splicing or stacking manner, and a gap may be present between the cells of the cell string formed in a splicing manner.

The above illustrates several embodiments of the present disclose, which is not intended to limit the present disclosure. Changes and modifications may be made by those skilled in the art without departing from the scope of the present disclosure. Whatever within the principles of the present disclosure, including any modification, equivalent substitution, improvement, etc., shall fall into the protection scope of the present disclosure.

It should be pointed out that the present disclosure contains some contents protected by copyright. Except for making copies of the patent documents or the contents of the recorded patent documents of the Patent Office, the copyright owner reserves the copyright.

What is claimed is:

1. A solar cell, comprising:
   an N-type semiconductor substrate comprising a front surface and a back surface;
   a first dielectric layer located on the front surface of the N-type semiconductor substrate;
   a first N+ doped layer located on a surface of the first dielectric layer;
   a first passivation layer located on a surface of the first N+ doped layer;
   a first electrode located on a surface of the first passivation layer;
   a second dielectric layer located on the back surface of the N-type semiconductor substrate;
   a first P+ doped layer located on a surface of the second dielectric layer;
   a second passivation layer located on a surface of the first P+ doped layer;
   a second electrode located on a surface of the second passivation layer;
   a third dielectric layer formed on a region of the surface of the first N+ doped layer; and
   a second N+ doped layer located on the third dielectric layer, wherein the first N+ doped layer and the first P+ doped layer are polycrystalline silicon layers, and a thickness of the first P+ doped layer is greater than a thickness of the first N+ doped layer, wherein the first electrode penetrates through the first passivation layer to be in direct contact with the second N+ doped layer, and wherein a thickness of the second N+ doped layer is greater than the thickness of the first N+ doped layer, and a thickness of the first dielectric layer is different from a thickness of the second dielectric layer.

2. The solar cell according to claim 1, wherein the thickness of the first P+ doped layer is within a range from 80 nm to 300 nm, the thickness of the first N+ doped layer is within a range from 5 nm to 30 nm, and the first P+ doped layer is an emitter region.

3. The solar cell according to claim 1, wherein the first N+ doped layer has a doping concentration in a range from $5 \times 10^{19}$ cm$^{-3}$ to $6 \times 10^{20}$ cm$^{-3}$, and the first P+ doped layer has a doping concentration in a range from $5 \times 10^{19}$ cm$^{-3}$ to $6 \times 10^{20}$ cm$^{-3}$.

4. The solar cell according to claim 1, wherein the first dielectric layer is doped with phosphorus, and the second dielectric layer is doped with an element different from phosphorus.

5. The solar cell according to claim 1, wherein a thickness of the second N+ doped layer is within a range of 50 nm to 150 nm.

6. The solar cell according to claim 1, wherein the second electrode penetrates through the second passivation layer to be in direct contact with the first P+ doped layer.

7. The solar cell according to claim 1, wherein the third dielectric layer and the second N+ doped layer both have a textured surface.

8. A solar cell, comprising:
a P-type semiconductor substrate comprising a front surface and a back surface;
a first dielectric layer located on the front surface of the P-type semiconductor substrate;
a first P+ doped layer located on a surface of the first dielectric layer;
a first passivation layer located on a surface of the first P+ doped layer;
a first electrode located on a surface of the first passivation layer;
a second dielectric layer located on the back surface of the P-type semiconductor substrate;
a first N+ doped layer located on a surface of the second dielectric layer;
a second passivation layer located on a surface of the first N+ doped layer;
a second electrode located on a surface of the second passivation layer;
a third dielectric layer formed on a region of the surface of the first P+ doped layer; and
a second P+ doped layer located on the third dielectric layer, wherein the first P+ doped layer and the first N+ doped layer are polycrystalline silicon layers, and a thickness of the first N+ doped layer is greater than a thickness of the first P+ doped layer, wherein the first electrode penetrates through the first passivation layer to be in direct contact with the second P+ doped layer, and wherein a thickness of the second P+ doped layer is greater than the thickness of the first P+ doped layer, and a thickness of the first dielectric layer is different from a thickness of the second dielectric layer.

9. The solar cell according to claim 8, wherein the thickness of the first N+ doped layer is within a range from 80 nm to 300 nm, the thickness of the first P+ doped layer is within a range from 5 nm to 30 nm, and the first N+ doped layer is an emitter region.

10. The solar cell according to claim 8, wherein the first N+ doped layer has a doping concentration in a range from $5 \times 10^{19}$ cm$^{-3}$ to $6 \times 10^{20}$ cm$^{-3}$, and the first P+ doped layer has a doping concentration in a range from $5 \times 10^{19}$ cm$^{-3}$ to $6 \times 10^{20}$ cm$^{-3}$.

11. The solar cell according to claim 8, wherein the first dielectric layer or the second dielectric layer is doped with phosphorus.

12. The solar cell according to claim 8, wherein a thickness of the second P+ doped layer is within a range of 50 nm to 150 nm.

13. The solar cell according to claim 8, wherein the second electrode penetrates through the second passivation layer to be in direct contact with the first N+ doped layer.

14. The solar cell according to claim 8, wherein the third dielectric layer and the second P+ doped layer both have a textured surface.

* * * * *